United States Patent
Liu

(10) Patent No.: US 6,872,598 B2
(45) Date of Patent: Mar. 29, 2005

(54) METHOD OF MAKING A THIN SEMICONDUCTOR CHIP

(75) Inventor: Yi Liu, Amagasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/374,100

(22) Filed: Feb. 27, 2003

(65) Prior Publication Data

US 2003/0173590 A1 Sep. 18, 2003

(30) Foreign Application Priority Data

Mar. 1, 2002 (JP) .................................. P2002-055908

(51) Int. Cl.⁷ .............................................. H01L 21/48
(52) U.S. Cl. ...................... 438/118; 438/118; 438/782; 438/906
(58) Field of Search ........................... 438/118, 143, 438/691, 692, 693, 633, 528

(56) References Cited

U.S. PATENT DOCUMENTS

| | | |
|---|---|---|
| 5,162,251 A | 11/1992 | Poole et al. |
| 6,398,892 B1 * | 6/2002 | Noguchi et al. ............... 156/85 |
| 6,676,492 B2 * | 1/2004 | Li .................................. 451/65 |
| 2003/0113984 A1 * | 6/2003 | Okada et al. ................ 438/459 |

FOREIGN PATENT DOCUMENTS

| | | |
|---|---|---|
| JP | 64-64771 A | 3/1989 |
| JP | 6-216092 A | 8/1994 |

* cited by examiner

*Primary Examiner*—David Nelms
*Assistant Examiner*—Thinh T Nguyen
(74) *Attorney, Agent, or Firm*—Brich, Stewart, Kolasch & Birch, LLP

(57) ABSTRACT

A semiconductor device wafer 11 is integrated with a supporting board 13 by a double-faced thermally foaming adhesive sheet 12, and this assembly is fixed to a vacuum sucking pedestal 14 under vacuum sucking. A thermally foaming adhesive layer of the adhesive sheet 12 functions as a shock absorber, whereby the wafer 11 hardly cracks during a high-speed grinding operation even if the wafer uses a GaAs substrate which is susceptible to damages. Neither fixing of the wafer 11 using wax nor abrasion using an oil abrasive agent is necessary, so that contamination of wax and oil is prevented and cleaning of the wafer becomes easy. Heating at 130° C. makes the thermally foaming adhesive layer of the adhesive sheet 12 expand so that the wafer 11 is readily separated from the adhesive sheet.

8 Claims, 4 Drawing Sheets

METHOD OF MAKING A THIN SEMICONDUCTOR CHIP

BACKGROUND OF THE INVENTION

The present invention generally relates to a method of manufacturing semiconductor chips and the semiconductor chips thus obtained. More particularly, the present invention relates to thinning of a semiconductor device wafer and semiconductor chips manufactured by using the thinned semiconductor device wafer.

In recent years, high density and integration of devices are continuously made in the field of compound semiconductors. As mobile communication equipment becomes more compact and lightweight, the devices become progressively fine. As the chip area becomes smaller, the thermal resistance of the device becomes increasingly high. It is indispensable to reduce the thermal resistance of the devices to allow realization of high-performance and high-reliability devices. For that purpose, various designs for improving heat radiation effect have been adopted. The most effective method of decreasing the thermal resistance of the device is to form a pattern of integrated circuit elements on a semiconductor wafer and then thin the semiconductor wafer to increase heat radiation to the rear surface of the semiconductor wafer.

FIG. 6 shows a conventional method of thinning a semiconductor device wafer 1. To thin the semiconductor device wafer 1, a protection resist 2 is applied to a surface of the semiconductor device wafer 1. Then the protection resist-applied surface of the semiconductor device wafer 1 is fixedly bonded to a vacuum sucking pedestal 4 with electron wax 3. Thereafter the vacuum sucking pedestal 4 is sucked to an abrading base 5 under vacuum and thinning of the wafer is performed. To thin the semiconductor device wafer 1, a method of grinding the semiconductor device wafer 1 with a grindstone or a method of polishing or abrading it with an abrasive material may be used. In the case where the semiconductor device wafer 1 is ground, a grindstone having a particle diameter of not less than 40 μm is typically used, and the grinding process is performed under flowing water. In the case where the semiconductor device wafer 1 is polished or abraded, a diamond oil abrasive material 6 having a particle diameter in the range of 3 μm to 9 μm and an oil lubricant are used. Reference numeral 7 denotes an abrading platen.

The particle diameter of the grindstone is larger than that of an abrasive material. Therefore when the grinding method is used, the thinning speed is higher, but the grindstone tends to give damage such as deep flaws to the surface of the semiconductor device wafer 1. Thus when the semiconductor device wafer 1 is ground thinly, it is liable to crack. Grinding is capable of thinning the semiconductor device wafer 1 to a thickness of about 150 μm. To thin the semiconductor device wafer 1 to a thickness of less than 150 μm, abrasion is normally used. In the abrasion, an abrasive material having a smaller particle diameter than the grindstone is used, and an oil abrasive material smooth and giving a low extent of damage to the surface of the semiconductor device wafer 1 is used.

Attention is particularly necessary to thinly abrade a GaAs substrate, which is more crackable than a Si substrate. For example, when the GaAs substrate is used for the semiconductor device wafer 1, the grinding, which allows the mass-production, is used to thin it to a thickness of about 150 μm or less. However, as described above, the grinding cannot be used to thin the semiconductor device wafer 1 to a thickness of about 100 μm or less.

When the GaAs substrate is desired to be thinned to a thickness of 100 μm or less, abrasion is used. However, when the GaAs substrate is abraded with an aqueous abrasive material, the GaAs substrate is much damaged. Thus an oil abrasive material giving small damage to the GaAs substrate is used normally.

However, even in the case where an oil abrasive material is used, a GaAs semiconductor device wafer having a dimension of not less than three inches is liable to crack in the stages of handling, cleaning, feeding, and/or mounting. Thus, disadvantageously, there was a limit (80 μm) in thinning the semiconductor device wafer by the conventional method.

In both the grinding method and the abrading method, it is necessary to bond the semiconductor device wafer 1 to the vacuum sucking pedestal 4 with the electron wax 3, separate the semiconductor device wafer 1 from the vacuum sucking pedestal 4 after it is thinned, and wash out the wax and the abrasive material. Thus it takes much time and costs high to thin the semiconductor device wafer 1. In particular, that is the case with the oil abrasive material. A high-viscosity oil lubricating material is typically used as the oil abrasive material. Consequently, the oil of the lubricating material remains in irregularities of an abraded surface of the semiconductor device wafer 1. It is difficult to completely remove remaining oil by means of an organic detergent. Therefore it is necessary to physically remove the oil by performing a mirror finishing process. However, the mirror finishing process is very inefficient in mass production.

When the oil remains on the abraded surface (rear surface) of the semiconductor device wafer 1, the oil adversely affects the adhesiveness of a metal layer to be plated on the rear surface of the semiconductor device wafer 1 in a later process. Consequently the metal layer is liable to be separated from the semiconductor device wafer 1.

SUMMARY OF THE INVENTION

Therefore, it is an object of the present invention to provide a method of manufacturing a semiconductor chip, and a high-performance and high-reliability semiconductor chip manufactured by the method, the method having a thinning process which prevents a semiconductor device wafer from cracks and contamination, and which is capable of thinning the semiconductor device wafer to a thickness smaller than ever, and which facilitates separation of the semiconductor device wafer from a vacuum sucking pedestal and cleaning thereof at a later stage.

To achieve the above object, in a method of manufacturing semiconductor chips according to an aspect of the present invention, a semiconductor device wafer having a semiconductor substrate and devices formed on the semiconductor substrate is prepared, and then the semiconductor device wafer is bonded to a supporting board with a double-faced adhesive sheet, whereby the semiconductor device wafer, double-faced adhesive sheet, and supporting board are integrated with one another. Then, a thinning treatment using water is performed upon the semiconductor device wafer integrated with the double-faced adhesive sheet and with the supporting board.

According to the construction, in performing the thinning treatment with the semiconductor device wafer bonded to the supporting board through the double-faced adhesive sheet, the double-faced adhesive sheet functions as a shock-absorber layer for the semiconductor device wafer. Therefore even though the semiconductor device wafer is ground by rotating it at a high speed in a thinning process, the semiconductor device wafer hardly cracks. Further since water is used in the thinning process, it is unnecessary to use an oil lubricant and a cooling agent. Therefore cleaning treatment is accomplished easily because only water is used therefor.

The double-faced adhesive sheet may have, on one side thereof, an adhesive layer having a thickness of not less than 20 μm and not more than 100 μm so as to well serve as a shock absorber for the semiconductor device wafer during the thinning operation. If the thickness of the adhesive layer is less than 20 μm, the layer is incapable of displaying sufficient cushioning performance. On the other hand, if the thickness of the adhesive layer is more than 100 μm, there may occur an in-plane thickness distribution due to the thinning operation.

In one embodiment, as the double-faced adhesive sheet, a double-faced adhesive sheet having either a thermally foaming adhesive layer or a photosensitive adhesive layer on one face thereof is used.

In the embodiment, in the thinning process, the thermally foaming adhesive layer or the photosensitive adhesive layer of the double-faced adhesive sheet acts as a cushioning medium, i.e., plays a shock-absorbing role for the semiconductor device wafer. When the double-faced adhesive sheet has the thermally foaming adhesive layer on its one surface, foaming or expansion of the thermally foaming adhesive caused by heating allows the semiconductor device wafer to separate from the supporting board. When the double-faced adhesive sheet has the photosensitive adhesive layer on its one surface, hardening of the photosensitive adhesive caused by irradiation of light allows the semiconductor device wafer to separate from the supporting board. Therefore the thinned semiconductor device wafer separates easily.

In one embodiment, the thermally foaming adhesive layer or the photosensitive adhesive layer of the double-faced adhesive sheet has a thickness of not less than 20 μm and not more than 100 μm.

If the thickness of the thermally foaming adhesive layer or that of the photosensitive adhesive layer is less than 20 μm, they are incapable of displaying sufficient cushioning performance as the shock-absorber layer and have a low adhesive force. On the other hand, if the thickness of the thermally foaming adhesive layer or the photosensitive adhesive layer is more than 100 μm, there may occur an in-plane thickness distribution due to the thinning operation. In the embodiment, the thermally foaming adhesive layer and the photosensitive adhesive layer have a thickness of between 20 μm and 100 μm inclusive. Therefore, whichever adhesive layer is formed, the adhesive layer functions optimally as the shock-absorber layer.

In one embodiment, aqueous grinding is performed in the thinning treatment, and a particle diameter of a grindstone used in the thinning treatment is set to not less than 1 μm and not more than 8 μm.

Since in the embodiment, the semiconductor device wafer is ground with a grindstone having a particle diameter of 1–8 μm inclusive, a maximum height of irregularities of a ground surface of the semiconductor device wafer becomes 3 μm or less. In this case, a damaged layer caused by the grounding is small in thickness, and has a maximum thickness of about 20 μm. Because the only grounding process gives such reduced damages to the wafer, even though the semiconductor device wafer, more precisely, the semiconductor substrate of the wafer is ground to a thickness in the range of 30 μm to 70 μm inclusive, the resulting semiconductor device wafer is prevented from being cracked.

In one embodiment, in order to lessen the damaged layer of the semiconductor device wafer, in the thinning treatment using water, abrasion is performed after the aqueous grinding is finished, and an aqueous abrasive agent is used for the abrasion.

According to the embodiment, a two-stage thinning operation, namely, the grinding operation and the abrading operation are performed by using water. Therefore the maximum height of irregularities of the ground surface of the semiconductor device wafer becomes reduced to 0.2 μm or less. Thus the maximum thickness of the damaged layer of the semiconductor device wafer becomes within 5 μm. Therefore it is possible to thin the semiconductor substrate of the wafer even to a thickness of 20 μm.

In this embodiment, an aqueous abrasive material is used in performing the abrading operation. Therefore unlike the conventional method using an oil abrasive material, a mirror finishing operation for removal of oil and a cleaning operation are not required. Thus, as a whole, it is possible to greatly shorten a process time required to manufacture the semiconductor chips. Further the abraded surface of the wafer is not contaminated with oil. Thus when a plating layer is formed on the abraded surface in a later stage, the plating layer is prevented from detaching from the semiconductor device wafer.

In one embodiment, the semiconductor device wafer integrated with the supporting board and the double-faced adhesive sheet are fixed to a pedestal by vacuum sucking in performing the thinning treatment. Therefore unlike the conventional method bonding the semiconductor device wafer to the pedestal with wax, wax removal from the wafer after the thinning operation is not necessary any more. Thus efficiency in mass production can be improved greatly.

In one embodiment, a maximum height of irregularities of a sucking surface of the pedestal is within 1 μm.

If the maximum height of the irregularities of the sucking surface of the pedestal, to which the supporting board adheres under vacuum, is more than 1 μm, then the force of fixing the supporting board to the pedestal by sucking is too low to withstand a high-speed rotary grinding. In the embodiment, the maximum height of the sucking surface irregularities of the pedestal is within 1 μm. Therefore it is possible to obtain a fixing force high enough to withstand a high-speed rotary grinding. Thus, it is possible to thin the semiconductor substrate of the wafer to a thickness of 30 μm–70 μm inclusive by grinding.

A semiconductor chip according to another aspect of the present invention has a semiconductor substrate having a thickness in the range of about 20–70 μm, and at least one device formed on the semiconductor substrate.

This semiconductor chip can be fabricated by the above-mentioned method of the present invention. Because the thickness of the semiconductor substrate of the semiconductor chip is as small as about 20–70 μm, it is possible to increase heat liberation to the rear surface of the semiconductor substrate. Therefore it is possible to realize a semiconductor chip which has high performance and reliability and is compact and lightweight.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS

The present invention will be described below with reference to the drawings.

<First Embodiment>

Figure 1A:
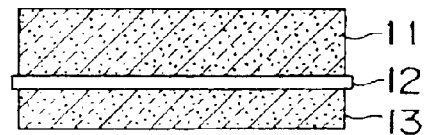
FIGS. 1A through 1E show the procedure of an operation of thinning a semiconductor device wafer in the method of manufacturing a semiconductor chip of the present invention.

FIGS. 1A through 1E show the procedure of thinning a semiconductor device wafer in the method of manufacturing a semiconductor chip according to a first embodiment. With reference to FIGS. 1A through 1E, especially thinning of the semiconductor device wafer will be described in detail below. As shown in FIG. 1A, initially a semiconductor device wafer 11 is fixed to a supporting board 13 made of Silicon by using a thermally foaming adhesive sheet 12 serving as a double-faced adhesive sheet. The semiconductor device wafer 11 has a GaAs substrate having a diameter of three inches and a thickness of 600 $\mu$m and a large number of devices (not shown) formed on the GaAs substrate at a front surface side thereof. The devices have thicknesses ranging from about 1–10 $\mu$m depending on the kind of the devices, so that a total thickness of the semiconductor device wafer 11 is about 601–610 $\mu$m. The semiconductor device wafer 11 is prepared in a known technique. Silicon having a diameter of three inches and a thickness of 380 $\mu$m is used as the supporting board 13. In the case where a process of partly plating a rear surface of the GaAs semiconductor device wafer 11 after thinning the GaAs semiconductor device wafer 11, a supporting board made of glass may be used as the supporting board 13 to match a pattern of the partial plating with that of the devices.

The thermally foaming adhesive sheet 12 has two adhesive surfaces. One side of the thermally foaming adhesive sheet 12 having a thermally foaming adhesive agent and detachable at about 130° C. is bonded to the surface of the GaAs semiconductor device wafer 11 on which devices are formed. The other side of the thermally foaming adhesive sheet 12 having an ordinary adhesive agent is bonded to a surface of the supporting board 13. As the thermally foaming adhesive sheet 12, a thermally separable sheet manufactured by Nitto Denko Corporation may be used.

Figure 2:
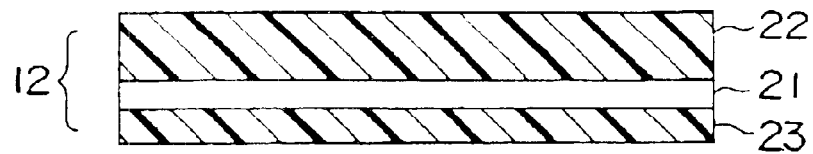
FIG. 2 shows a sectional construction of a thermally foaming adhesive sheet shown in FIGS. 1A–1D.

FIG. 2 shows a sectional construction of the thermally foaming adhesive sheet 12. The thermally foaming adhesive sheet 12 includes a base film 21, a thermally foaming adhesive layer 22 consisting of a thermally foaming adhesive agent applied to one surface of the base film 21, and an ordinary adhesive layer 23 consisting of an ordinary adhesive agent applied to the other surface of the base film 21. Instead of the thermally foaming adhesive layer 22, a photosensitive adhesive layer consisting of a photosensitive adhesive agent may be used. In this case, irradiating the photosensitive adhesive layer with light causes the GaAs semiconductor device wafer 11 to separate from the photosensitive adhesive layer.

The thermally foaming adhesive layer 22 of the thermally foaming adhesive sheet 12 is sufficiently thick to act as a cushioning medium, i.e., plays a shock-absorbing role for the bonded semiconductor device wafer 11. Therefore owing to the use of the thermally foaming adhesive layer 22, even though the semiconductor device wafer 11 is ground while being rotated at a high speed, the semiconductor device wafer 11 hardly cracks and can be thinned to a higher extent. The thickness of the thermally foaming adhesive layer 22 or that of the photosensitive adhesive layer is preferably in the range of 20 $\mu$m to 100 $\mu$m to make them function as the shock-absorber layer. If the thickness of the thermally foaming adhesive layer 22 or that of the photosensitive adhesive layer is less than 20 $\mu$m, they are incapable of having sufficient cushioning performance as the shock-absorber layer. Consequently the semiconductor device wafer 11 is liable to crack in a grinding process or an abrading process for thinning the semiconductor device wafer 11. If the thermally foaming adhesive layer 22 or that of the photosensitive adhesive layer is further thinned to a thickness of about 10 $\mu$m, then they will have a decreased adhesive strength and thus have difficulty in holding the semiconductor device wafer 11 thereon. On the other hand, if the thermally foaming adhesive layer 22 or the photosensitive adhesive layer is as thick as more than 100 $\mu$m, they have sufficient cushioning performance but there occurs an in-plane thickness distribution due to the grinding or abrasion process, resulting in a non-uniform thickness. Therefore the thickness of the thermally foaming adhesive layer 22 or the photosensitive adhesive layer is preferably in the range of 20 $\mu$m to 100 $\mu$m.

Figure 1B:
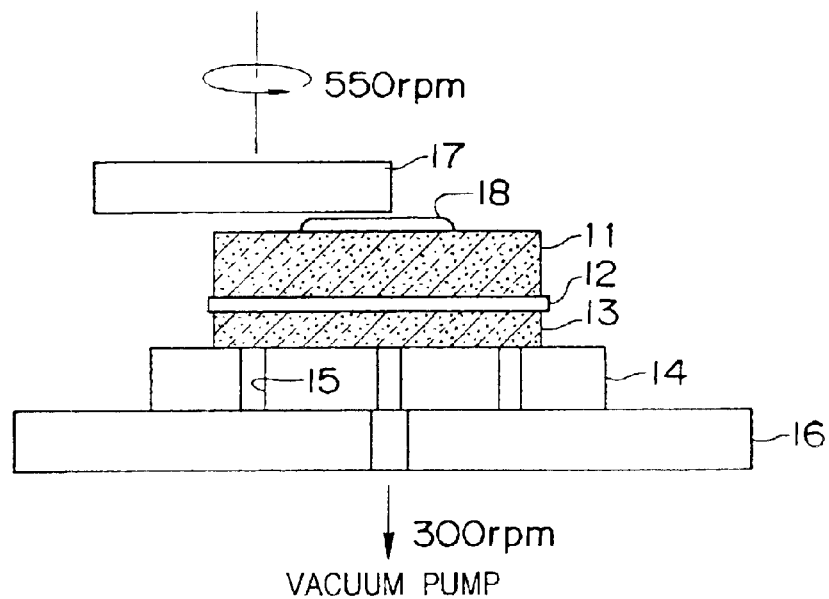

As shown in FIG. 1B, the semiconductor device wafer 11, the thermally foaming adhesive sheet 12, and the supporting board 13, which are bonded together, are directly fixed to a vacuum sucking pedestal 14 by vacuum sucking. The vacuum sucking pedestal 14 has vacuum-sucking holes 15 formed therethrough. The vacuum-sucking holes 15 are connected to a vacuum pump through a through-hole of an abrading platform 16 to exhaust air present between the supporting board 13 and the vacuum sucking pedestal 14.

Figure 3A:
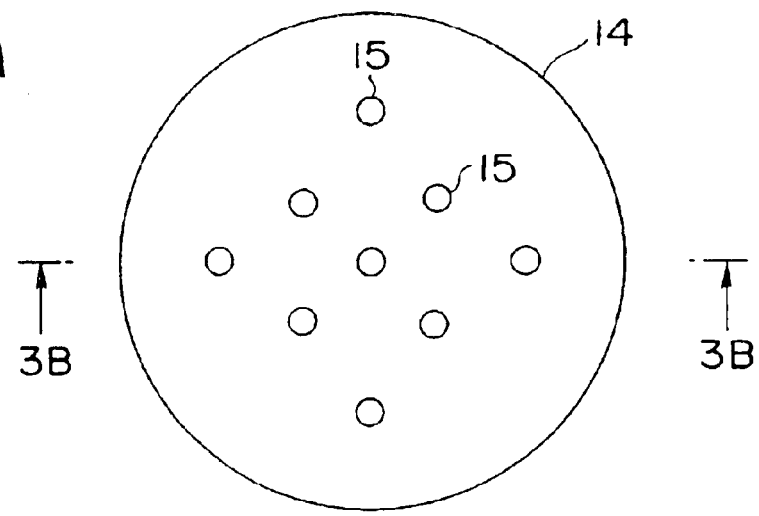
FIG. 3A is a plan view showing a vacuum sucking pedestal shown in FIG. 1B.
Figure 3B:
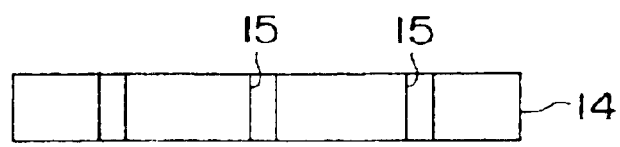
FIG. 3B is a sectional view taken along line 3B—3B of FIG. 3A.

The strength of the vacuum sucking in performing the vacuum sucking is required to be sufficiently high to withstand a frictional force generated between the semiconductor device wafer 11 and a grinding wheel which rotates at a high speed when the semiconductor device wafer 11 is ground. Since the maximum height of surface irregularities of the vacuum sucking pedestal is about 5 $\mu$m in general vacuum sucking, the sucking force is insufficient to withstand the high-speed grinding. However, the vacuum sucking pedestal 14 used in the first embodiment is made of flat ceramics or glass whose maximum height of surface irregularities is within approx. 1 $\mu$m. Therefore the adhesiveness of the vacuum sucking pedestal 14 to the supporting board 13 in the first embodiment is higher than when using a general vacuum sucking pedestal. As shown in FIG. 3, five or more vacuum-sucking holes 15 each having a diameter of not less than 5 mm are formed through the vacuum sucking pedestal 14 to increase the sucking force. Consequently it is possible to increase the strength of fixing the supporting board 13 to the vacuum sucking pedestal 14 to such an extent as to withstand the grinding or abrasion operation. It is possible to thin the semiconductor device wafer with high reliability and precision without the semiconductor device wafer from being contaminated with wax or other materials.

Thereafter as shown in FIG. 1B, the rear surface of the semiconductor device wafer 11 is thinned to a thickness of 70 $\mu$m by grinding. In this case, the rear surface of the semiconductor device wafer 11 is ground with a grinding wheel 17 rotating at 550 rpm, with cooling water 18 flowing thereon. The number of rotations of the semiconductor device wafer 11 is set to 300 rpm. When the particle diameter of the grindstone 17 is large, a grinding time can be reduced. However, the semiconductor device wafer 11 is damaged greatly, and the rear surface thereof ground thereby is rough.

Figure 4:
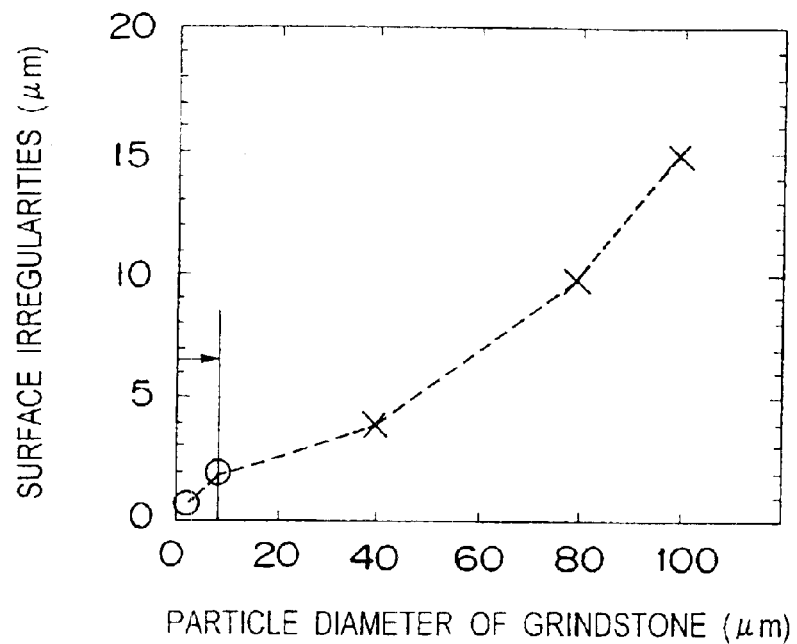
FIG. 4 shows the relationship between a maximum height of surface irregularities of a ground GaAs semiconductor device wafer and a particle diameter of a grindstone.

FIG. 4 shows the relationship between the maximum height of surface irregularities of the ground GaAs semiconductor device wafer 11 and the particle diameter of the grindstone 17. As shown in FIG. 4, by using the grindstone 17 whose particle diameter is about 40 $\mu$m or less, it is possible to obtain the semiconductor device wafer 11 having a maximum height of the surface irregularity at about 4 $\mu$m or less. To reduce the maximum height of the surface irregularity of the semiconductor device wafer 11 to 3 $\mu$m or less, the grindstone 17 having a particle diameter of not less than 1 $\mu$m but not more than 8 $\mu$m should be used. In the first embodiment, the GaAs semiconductor substrate having a thickness of 600 $\mu$m is ground to a thickness of 30 $\mu$m with the grindstone 17 having a particle diameter of 2 $\mu$m. In this case, the maximum height of the surface irregularities of the semiconductor device wafer 11 can be reduced to about 1 $\mu$m. In this case, the entirety of the ground surface of the semiconductor device wafer 1 becomes glossy. In this case, it takes about 10 minutes to grind the semiconductor device wafer 11.

Figure 1C:
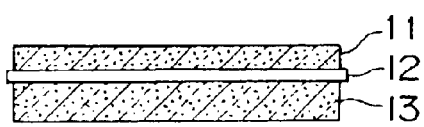

Thereafter, as shown in FIG. 1C, the thinned semiconductor device wafer 11, the thermally foaming adhesive sheet 12, and the supporting board 13, which are bonded together, are removed from the vacuum sucking pedestal 14 to wash them. Thereafter an oxide film formed on the ground surface of the semiconductor device wafer 11 is removed by about 1 $\mu$m by etching with an etchant of phosphoric acid.

Figure 1D:
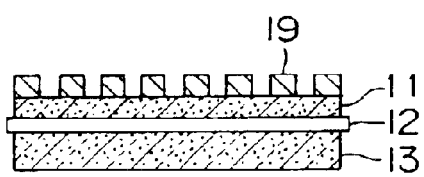

As shown in FIG. 1D, a back metal plating process to evaporate and plate with gold (Au) is performed to form a back metal layer 19 on the ground surface of the semiconductor device wafer 11. The gold is evaporated to a thickness of 0.2 $\mu$m and plated to a thickness of 5 $\mu$m. The back metal plating is not limited to the evaporation and plating of the gold, but it is possible to evaporate the gold and plate copper (5 $\mu$m) and then evaporate gold again to a thickness of 0.02 $\mu$m to prevent oxidation of the copper.

Figure 1E:
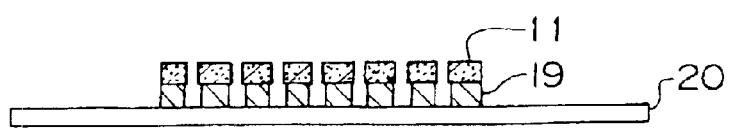

Thereafter, the semiconductor device wafer 11 integrated with the thermally foaming adhesive sheet 12 and with the supporting board 13 is heated to 130° C. Then, the thermally foaming adhesive layer 22 of the thermally foaming adhesive sheet 12 foams, and the thinned and plated semiconductor device wafer 11 separates from the thermally foaming adhesive sheet 12 and thus from the supporting board 13. Thereafter the plated surface of the semiconductor device wafer 11 is cleaned. Thereafter as shown in FIG. 1E, a dicing sheet 20 is bonded to the plated surface of the semiconductor device wafer 11 to divide the semiconductor device wafer 11 into individual semiconductor chips by dicing or cleavage.

Figure 7:
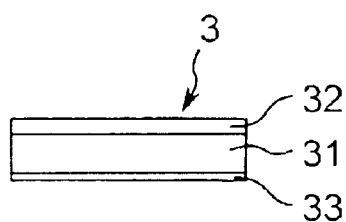
FIG. 7 is a schematic view of an example of a semiconductor chip fabricated by the manufacturing method of the present invention.

FIG. 7 schematically shows a semiconductor chip 3 thus obtained. The semiconductor chip 3 has a semiconductor substrate portion 31, a device portion 32 including at least one device formed on the semiconductor substrate, and a back metal plating layer 33. The semiconductor substrate 31 has a thickness of 30 $\mu$m in the first embodiment, while the device portion 32 does not have a constant thickness but has a slightly uneven thickness which varies in the range of about 1–10 $\mu$m depending on the kind of the device [for example, about 1–3 $\mu$m in the case of field effect transistors (FET) and several $\mu$m to about 10 $\mu$m in the case of hetero bipolar transistors (HBT)]. Because the present invention does not reside in the structure of the device portion 32 itself, details of the device portion 32 are not shown in the figure. It should be understood that the present invention is applicable to any structure of the device portion 32.

It was confirmed that thinning the semiconductor device wafer 11 with the grindstone 17 having a particle diameter of 2 $\mu$m hardly causes the semiconductor device wafer 11 to be damaged at the ground surface or broken even though the semiconductor substrate is abraded to a thickness of 30 $\mu$m.

As described above, in the first embodiment, in fixing the semiconductor device wafer 1 to the vacuum sucking pedestal 14 by vacuum sucking, the thermally foaming adhesive sheet 12 having the thermally foaming adhesive layer 22 and the ordinary adhesive layer 23 is fixed to the supporting board 13 made of silicon, with the thermally foaming adhesive layer 22 bonded to the semiconductor device wafer 11. Thereby the semiconductor device wafer 11, the thermally foaming adhesive sheet 12, and the supporting board 13 are integrated with one another.

Therefore, by setting the thickness of the thermally foaming adhesive layer 22 to the range of 20 $\mu$m to 100 $\mu$m, it is possible to make the thermally foaming adhesive layer 22 function as the shock-absorber layer in grinding the semiconductor device wafer 11. Thus the semiconductor device wafer 11 is hardly cracked or broken when it is ground at a high rotation speed. Consequently even though the semiconductor device wafer 11 uses a GaAs semiconductor substrate that is easily damaged, it is possible to thin the semiconductor substrate to a thickness in the range of about 30 $\mu$m to 70 $\mu$m. At that time, by using the grindstone 17 having a particle diameter in the range of 1 $\mu$m to 8 $\mu$m, it is possible to reduce the maximum height of surface irregularities of the ground surface of the semiconductor device wafer 11 to 3 $\mu$m or less.

In a conventional grinding operation, a grindstone having a particle size of not less than 100 $\mu$m is used. Therefore a maximum height of surface irregularities of the semiconductor device wafer surface ground in the conventional grinding operation is not less than 10 $\mu$m. Thus the semiconductor device wafer is greatly damaged. The damage to the semiconductor device wafer depends mainly on the particle diameter of the grindstone, a grinding speed, and a pressure applied to the wafer. The thickness of a wafer layer damaged by grinding is 10 to 20 times as large as the maximum height of irregularities of the ground surface. Thus to reduce the thickness of the damaged layer, reduction of the maximum height of irregularities of the ground surface is most effective. That is, as described in the first embodiment, by limiting the particle size of the grindstone to as minute as 1 $\mu$m to 8 $\mu$m and optimizing the grinding speed and the pressure applied to the semiconductor device wafer, the extent of the collision between the semiconductor device wafer 11 and the grindstone 17 is relieved. Thereby the maximum height of irregularities of the ground surface is reduced to 3 µm or less. Consequently the semiconductor device wafer 11 is hardly damaged and does not crack, even though it is ground to a thickness of as small as 30 µm to 70 µm.

Since the thermally foaming adhesive layer 22 foams or expands when it is heated to 130° C., the semiconductor device wafer 11 can be easily separated from the thermally foaming adhesive sheet 12 and the supporting board 13 integral with the thermally foaming adhesive sheet 12. Therefore unlike the method of fixing the semiconductor device wafer to the vacuum sucking pedestal 14 with wax, it is possible to prevent the semiconductor device wafer from being contaminated with the wax.

Further in the first embodiment, as the vacuum sucking pedestal 14, flat ceramics or glass whose maximum height of surface irregularities is within 1 µm is used, and five or more vacuum-sucking holes 15 having a diameter of not less than 5 mm are formed through the vacuum sucking pedestal 14. Thus the adhesion of the supporting board 13 to the vacuum sucking pedestal 14 is higher than the adhesion of the supporting board 13 to the conventional vacuum sucking pedestal to such an extent that the fixing strength withstands the high-speed grinding. Consequently it is unnecessary to use an oil abrasive material-used abrading method and eliminate the mirror surface finish process for removing remaining oil. Thereby it is possible to accomplish mass production.

It has been hitherto necessary to apply a protection resist on the surface of devices fabricated in the wafer to protect the devices from being contaminated by long-time abrasion of the surface thereof. Unlike the conventional method, the semiconductor device wafer 11 is thinned not by abrasion but by grinding in the first embodiment. Therefore it is possible to shorten a thinning time and eliminate the process of applying the protection resist to the surface of devices to protect the devices and the process of removing the protection resist therefrom.

In the first embodiment, aqueous grinding is performed, with the semiconductor device wafer 11 fixed by bonding to the supporting board 13 through the thermally foaming adhesive sheet 12 and by vacuum sucking. Thus it is unnecessary to use wax or oil unlike the conventional method and possible to clean the surfaces of the devices by means of only high-speed jetting of water in the dicing process. Thus it is easy to accomplish cleaning and separation of the semiconductor device wafer 11. Consequently cracking or fracture of the semiconductor device wafer 11 is prevented in the separation operation.

As apparent from the foregoing description, in the first embodiment, it is possible to greatly improve yield of manufacture and production efficiency. Individual semiconductor chips into which the semiconductor device wafer is divided by the dicing process each have a semiconductor substrate thinned to a thickness of 30 µm to 70 µm. Therefore it is possible to increase heat radiation to the rear surface of the semiconductor substrate and thus realize a semiconductor chip which has high performance and reliability and is compact and lightweight.

The semiconductor device wafer 11 having a diameter of three inches has been described in the first embodiment. But the present invention is also applicable to a GaAs semiconductor device wafer having a diameter of four inches or more.

<Second Embodiment>

The second embodiment will be described below with reference to FIGS. 1A–1E. In the second embodiment, a maximum height of surface irregularities of a ground surface of a semiconductor device wafer is reduced to a thickness of 1 µm or less by abrading the semiconductor device wafer after it is ground.

The process of grinding the semiconductor device wafer is similar to that of the first embodiment. The grinding process will be described briefly below. As shown in FIGS. 1A and 1B, the semiconductor substrate of the semiconductor device wafer 11 having a thickness of 600 µm is thinned to a thickness of 70 µm by using the grindstone 17 having a particle diameter of 8 µm. The thinning operation takes about 10 minutes. At the moment, the maximum height of surface irregularities of the ground surface of the semiconductor device wafer 11 is about 3 µm.

Upon the completion of the grinding process, an abrading process starts. In the abrading process, the vacuum sucking pedestal 14 used in the grinding process is used. The semiconductor device wafer 11 is abraded until the substrate has a thickness of 30 µm, with an aqueous abrasive material giving less damage to the semiconductor device wafer 11 than a grinding material. The abrasive material consists of powder of SiC having a particle diameter of 8 µm. The abrasive material is used in the form of a mixture with water. It takes five minutes to abrade the semiconductor device wafer 11. Then the semiconductor device wafer 11 is further abraded for 10 minutes with a mixture of a powdery abrasive material made of $Al_2O_3$ having a particle diameter of 0.01 µm with water.

It is possible to reduce the maximum height of irregularities of the abraded surface of the semiconductor device wafer 11 to about 0.2 µm or less by performing a two-stage thinning method in which grinding and abrasion are performed. Thus it is possible to further reduce the extent of damage of the surface ground with the grindstone having a large particle diameter. Therefore the substrate of the semiconductor device wafer 1 can be thinned even to 20 µm.

After the abrading process finishes, the thinned semiconductor device wafer 11, thermally foaming adhesive sheet 12, and supporting board 13 are removed in one piece from the vacuum sucking pedestal 14. As in the case of the first embodiment, the surface of the thinned semiconductor device wafer 11 is cleaned with water, and an oxide film formed on the surface of the semiconductor device wafer 11 is removed by about 1 µm by etching with an etchant of phosphoric acid. There follow back metal plating using gold, separation of the semiconductor device wafer 11 from the supporting board 13 by heating at 130° C., and dicing of the wafer to chips. A resulting semiconductor chip is similar to that shown in FIG. 7, except that the thickness of the semiconductor substrate portion in the second embodiment is smaller.

When a diamond oil abrasive material is used in the abrading process, a slight amount of impurities such as oil and wax stays in the irregularities of the abraded surface of the semiconductor device wafer 11 because the oil-based lubricant is used in combination with the diamond oil abrasive material. It is difficult to chemically remove them completely. Consequently a back metal plating layer formed in a later process will have a low adhesion to the rear surface of the semiconductor device wafer.

In contrast, in the abrading process of the second embodiment, the aqueous SiC abrasive material is used. The SiC abrasive material has a characteristic that the particles of the material are broken to a particle diameter of about 8 µm during the abrading process. Thus the abrasion rate becomes gradually low. However, because the particle diameter is further reduced up to about 2 µm, the use of the SiC abrasive material contributes much to reduction of the extent of irregularities of the abraded surface of the semiconductor device wafer 11.

Adopted in the abrading process of the second embodiment is the method of fixing the supporting board 13 integrated with the semiconductor device wafer 11 and with the thermally foaming adhesive sheet 12 to the vacuum sucking pedestal 14 by vacuum sucking. Therefore unlike the conventional art, there is no need of fixing the semiconductor device wafer to the vacuum sucking pedestal with wax and thus there is no need of performing a cleaning process for wax removal. Furthermore, it is possible to avoid deterioration of the adhesion between the GaAs semiconductor device wafer and the gold-plated layer, which deterioration would occur when wax is used and remains at the plated surface of the wafer.

Figure 5:
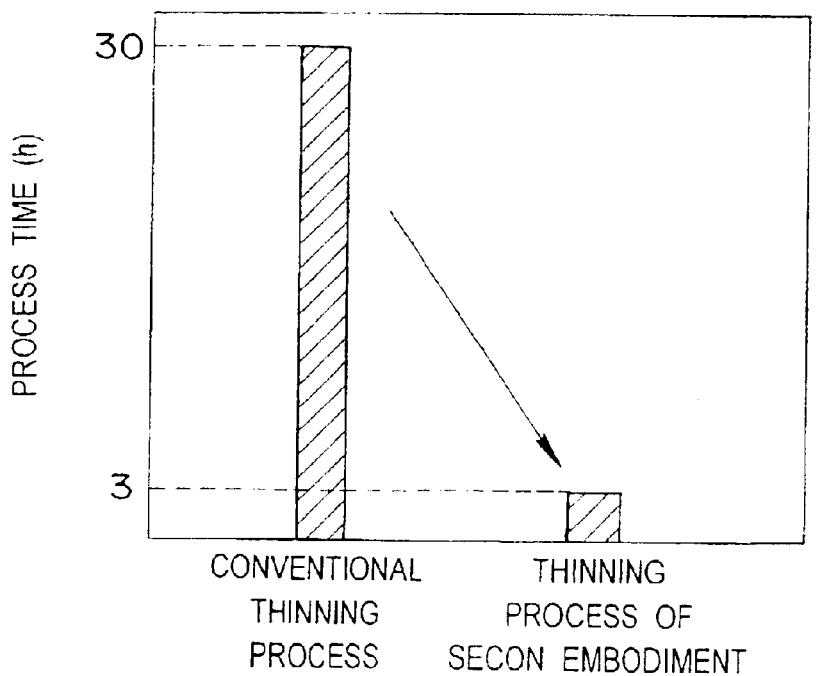
FIG. 5 shows a period of time required in a conventional thinning process in comparison with that required in a thinning process of a second embodiment of the present invention.
Figure 6:
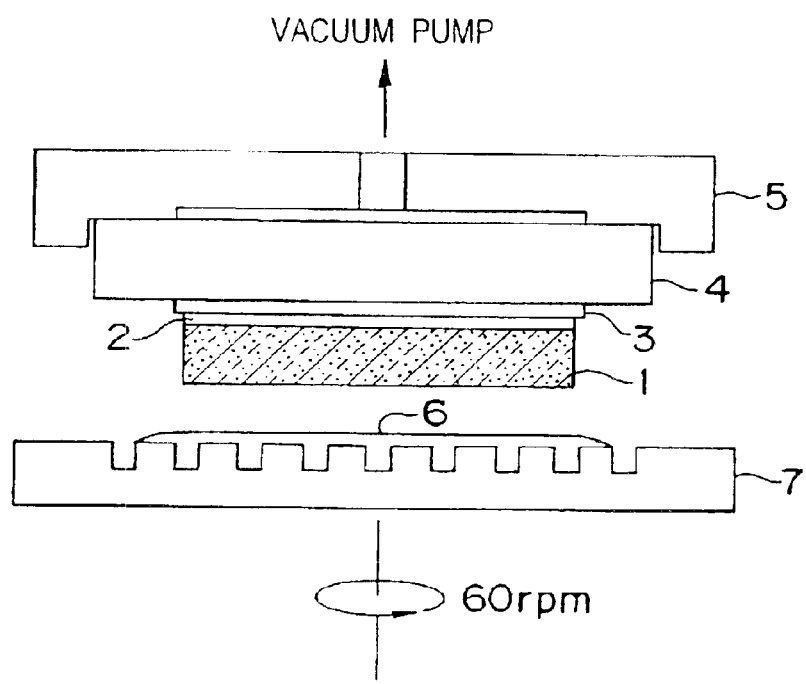
FIG. 6 is an explanatory view for explaining a conventional method of thinning a semiconductor device wafer.

FIG. 5 shows a process time from the thinning process including grinding and abrasion, to the dicing process in the second embodiment, in comparison with a process time required from the thinning process including grinding or abrasion, to the dicing process in the conventional art in which the semiconductor device wafer is fixed to the vacuum sucking pedestal with wax. As shown in FIG. 5, when using the thinning process of the second embodiment, the process time is about three hours, which is about 1/10 of the period of time of 30 hours required when using the conventional thinning process. This indicates that the thinning process of the second embodiment can improve production efficiency greatly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing semiconductor chips comprising:

preparing a semiconductor device wafer having a semiconductor substrate and devices formed on the semiconductor substrate;

bonding the semiconductor device wafer to a supporting board with a double-faced adhesive sheet to thereby integrate the semiconductor device wafer, double-faced adhesive sheet, and supporting board with one another, the double faced adhesive sheet having, on one side thereof, a thermally foaming adhesive layer adhering to the semiconductor device wafer and performing a thinning treatment using water upon the semiconductor device wafer integrated with the double-faced adhesive sheet and with the supporting board.

2. A method according to claim 1, wherein the thermally foaming adhesive layer of the double-faced adhesive sheet has a thickness of not less than 20 $\mu$m and not more than 100 $\mu$m.

3. A method according to claim 1, wherein aqueous grinding is performed in the thinning treatment, and a particle diameter of a grindstone used in the thinning treatment is set to not less than 1 $\mu$m and not more than 8 $\mu$m.

4. A method according to claim 3, wherein a maximum height of irregularities of a ground surface of the semiconductor device wafer resulting from the aqueous grinding is 3 $\mu$m or less.

5. A method according to claim 3, wherein in the thinning treatment using water, abrasion is performed after the aqueous grinding is finished; and an aqueous abrasive agent is used for the abrasion.

6. A method according to claim 1, wherein the supporting board integrated with the double-faced adhesive sheet and the semiconductor device wafer is fixed to a pedestal by vacuum sucking in performing the thinning treatment.

7. A method according to claim 6, wherein a maximum height of irregularities of a sucking surface of the pedestal is within 1 $\mu$m.

8. A method of manufacturing semiconductor chips comprising:

preparing a semiconductor device wafer having a semiconductor substrate and devices formed on the semiconductor substrate;

bonding the semiconductor device wafer to a supporting board with a double-faced adhesive sheet having a thermally foamed adhesive layer 20 $\mu$m to 100 $\mu$m thick to thereby integrate the semiconductor device wafer, double-faced adhesive sheet, and supporting board with one another;

grinding the semiconductor device wafer integrated with the double-faced adhesive sheet to a thickness of about 70 $\mu$m using a grindstone; and abrading the semiconductor device wafer integrated with the double-faced adhesive sheet to a thickness of less than about 30 $\mu$m using the grindstone.

* * * * *